(12) United States Patent
Don

(10) Patent No.: US 10,892,568 B2
(45) Date of Patent: Jan. 12, 2021

(54) CONNECTION ASSEMBLY FOR CONNECTING A THIN CONDUCTOR PIECE TO A THICK CONDUCTOR PIECE

(71) Applicant: TE Connectivity Germany GmbH, Bensheim (DE)

(72) Inventor: Tran-Son Don, Sandhausen (DE)

(73) Assignee: TE Connectivity Germany GmbH, Bensheim (DE)

( * ) Notice: Subject to any disclaimer, the term of this patent is extended or adjusted under 35 U.S.C. 154(b) by 0 days.

(21) Appl. No.: 16/360,103

(22) Filed: Mar. 21, 2019

(65) Prior Publication Data

US 2019/0296454 A1   Sep. 26, 2019

(30) Foreign Application Priority Data

Mar. 21, 2018 (EP) ..................................... 18163066

(51) Int. Cl.
| | |
|---|---|
| *H05K 1/11* | (2006.01) |
| *H01R 4/28* | (2006.01) |
| *H01R 12/65* | (2011.01) |
| *H01R 43/20* | (2006.01) |
| *H01R 12/77* | (2011.01) |
| *H01R 12/79* | (2011.01) |

(Continued)

(52) U.S. Cl.
CPC ............... *H01R 4/28* (2013.01); *H01R 12/65* (2013.01); *H01R 12/771* (2013.01); *H01R 12/79* (2013.01); *H01R 43/205* (2013.01); *H05K 1/0281* (2013.01); *H05K 1/118* (2013.01); *H05K 1/0393* (2013.01); *H05K 1/112* (2013.01); *H05K 2201/09081* (2013.01);

*H05K 2201/10037* (2013.01); *H05K 2201/1059* (2013.01); *H05K 2201/10242* (2013.01); *H05K 2201/10401* (2013.01)

(58) Field of Classification Search
CPC ........ H01R 4/28; H01R 12/79; H01R 12/771; H01R 43/205; H01R 12/65; H05K 1/118; H05K 2201/10401; H05K 2201/10242; H05K 2201/09081; H05K 2201/1059; H05K 2201/10037

See application file for complete search history.

(56) References Cited

U.S. PATENT DOCUMENTS 3,702,455 A * 11/1972 Raynor .................. H01R 33/09
                                                              439/558
3,980,367 A *  9/1976 Laserson .............. H01R 12/523
                                                              439/65

(Continued)

FOREIGN PATENT DOCUMENTS

| DE | 29712206 U1 | 8/1997 |
|---|---|---|
| EP | 2658036 A1 | 10/2013 |

OTHER PUBLICATIONS

Machine translation of DE29712206, published Aug. 28, 1997.*
European Search Report, dated Sep. 21, 2018, 9 pages.

*Primary Examiner* — Ishwarbhai B Patel
(74) *Attorney, Agent, or Firm* — Barley Snyder

(57) ABSTRACT

A connection assembly generally comprising a thick conductor piece including a receptacle with an inner wall and a thin conductor piece. The thin conductor piece has a protrusion for insertion into the receptacle. A press-fit element can be inserted into the receptacle with the protrusion arranged in the receptacle between the press-fit element and the thick conductor piece.

18 Claims, 3 Drawing Sheets

(51) Int. Cl.
*H05K 1/02* (2006.01)
*H05K 1/03* (2006.01)

(56) References Cited

U.S. PATENT DOCUMENTS

| | | | | |
|---|---|---|---|---|
| 5,189,261 | A * | 2/1993 | Alexander | H01L 23/5384 174/263 |
| 7,347,698 | B2 * | 3/2008 | Dittmann | B23P 15/00 439/45 |
| 2008/0233793 | A1 | 9/2008 | Ju | |
| 2019/0014660 | A1 * | 1/2019 | Brammer | H01R 12/585 |

* cited by examiner

CONNECTION ASSEMBLY FOR CONNECTING A THIN CONDUCTOR PIECE TO A THICK CONDUCTOR PIECE

CROSS-REFERENCE TO RELATED APPLICATIONS

This application claims the benefit of the filling date under 35 U.S.C § 119(a)-(d) of European Patent Application No. 18163066.6, filed on Mar. 21, 2018.

FIELD OF THE INVENTION

The present invention relates to a connection assembly for electrically connecting a thin conductor piece to a thick conductor piece for a battery management system. The invention further relates to a method for connecting a thin conductor piece with a thick conductor piece.

BACKGROUND

In the known art, the connecting of thin conductor pieces with thick conductor pieces can be a challenging task. Known ways of providing such connections, for example by means of screw joints, bear the risk that the thin conductor piece may get damaged by the screw. Further, the reliability of the connection may be insufficient. Other means, such as soldering or welding bear the risk that the high temperature may melt and damage the thin conductor piece. Also, if the conductors are made from different materials, such as aluminum and copper, the difficulty of forming a reliable electrical connection between the conductors is further increased.

SUMMARY

A connection assembly comprises a thick conductor piece including a receptacle having an inner wall and a thin conductor piece, for electrically connecting to the thick conductor piece and having a protrusion for insertion into the receptacle. A press-fit element is inserted into the receptacle with the protrusion in the receptacle between the press-fit element and the thick conductor piece.

A method for connecting a thin conductor piece with a thick conductor piece comprises inserting a protrusion on the thin conductor piece into a receptacle in the thick conductor piece, inserting a press-fit element into the receptacle, and pressing the protrusion against an inner wall of the receptacle.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
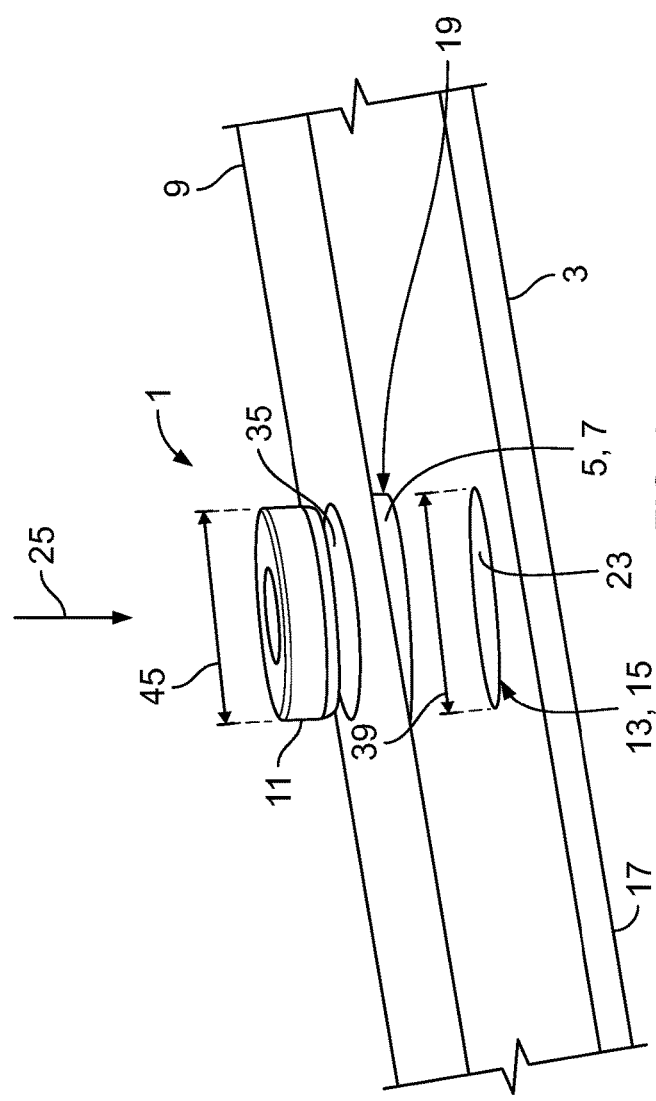
FIG. 1 is an exploded perspective view of a connection assembly prior to the connection of the conductors and prior to insertion of the press-fit element according to an embodiment.

Embodiments of the present disclosure will be described hereinafter in detail with reference to the attached drawings, wherein like reference numerals refer to like elements. The present invention may, however, be embodied in many different forms and should not be construed as being limited to the embodiments set forth herein; rather, these embodiments are provided so that the present disclosure will convey the concept of the invention to those skilled in the art.

Figure 2:
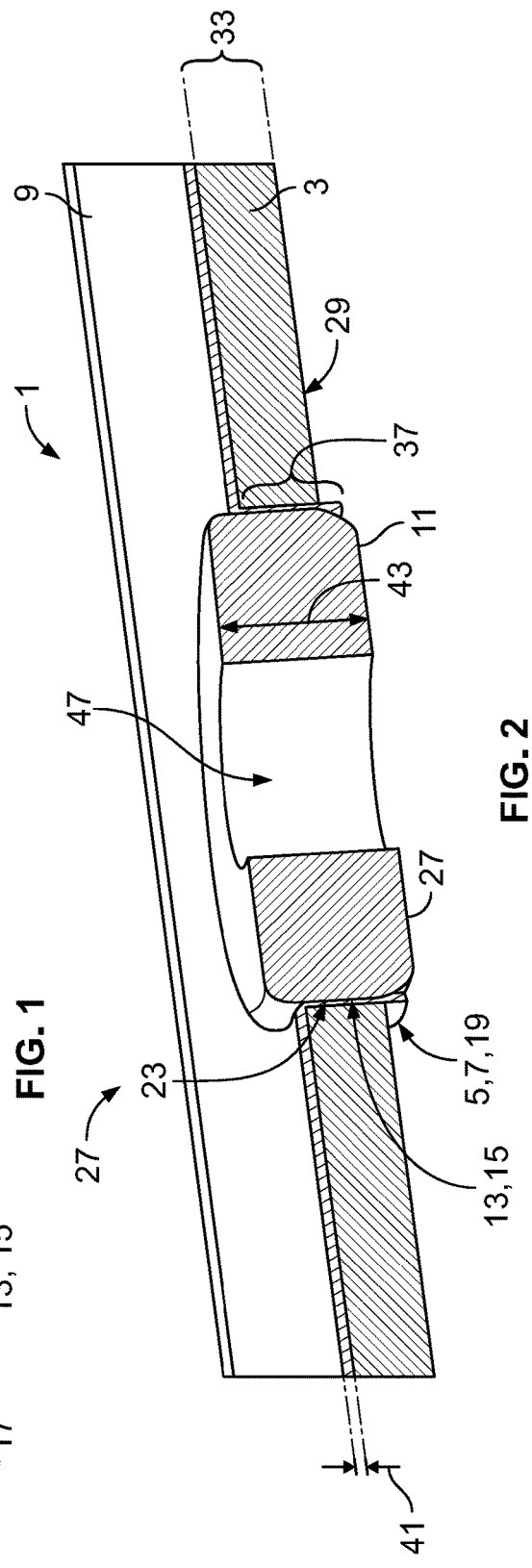
FIG. 2 is a cross-sectional perspective view of the connection assembly in an assembled state of the press-fit element of FIG. 1.
Figure 3:
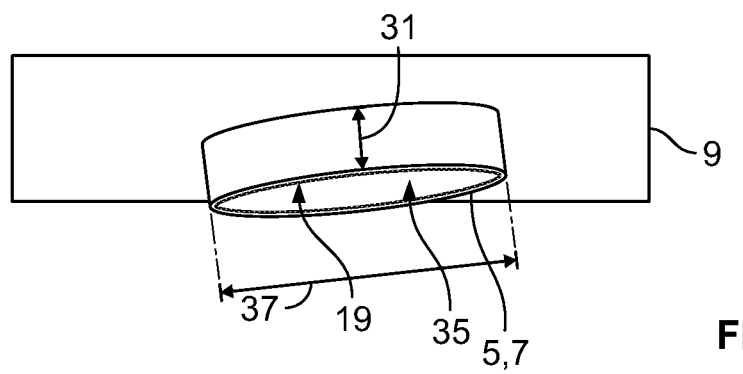
FIG. 3 is a perspective close-up view of the protrusion of the connection assembly of FIG. 1.

A connection assembly 1 according to the invention is described with respect to FIGS. 1 to 3.

The connection assembly 1 comprises a thick conductor piece 3. In an embodiment, the thick conductor piece 3 is made from aluminum or an alloy containing mostly aluminum. Likewise, in an embodiment, the thick conductor piece 3 has a plate-like shape (e.g., sheet metal sheet). However, this construction is not mandatory. The thick conductor piece 3 is in some embodiments part of a cell connector from a battery system.

The assembly 1 further comprises a thin conductor piece 5 for connection with the thick conductor piece 3. The thin conductor piece 5 of the example embodiment is a copper layer 7 of a flexible printed circuit (FPC) 9. In the alternative, the thin conductor piece 5 may also be a conducting foil, a conducting metal sheet, or a part of a flat flexible cable (FFC). In an embodiment, the thin conductor piece 5 is made from copper or an alloy containing mostly copper. If, for example, the thin conductor piece 5 is a layer of a (FPC) or another multilayered structure, then the at least one protrusion 19 may also comprise at least one additional layer. Further, if the thin conductor piece 5 is a copper layer that is joined to an additional layer, such as a polyimide layer, then the protrusion 19 may be formed from both of these layers. Thereby, a processing step, in which the conducting layer that forms the thin conductor piece 5 is separated from the other layer, can be omitted. In the case of a multilayer structure, the protrusion 19 is formed such that the thin conductor piece 5 forms the outer surface of the protrusion 19 in order to contact the inner wall 23 of the receptacle 15. The other layer can be arranged between the thin conductor piece 5 and the press-fit element 11 in the assembled state 21.

Additionally, the assembly 1 also comprises a press-fit element 11.

As shown in FIG. 1, the thick conductor piece 3 is provided with a through hole 13 that forms a receptacle 15 for receiving the press-fit element 11. The through hole 13, in an embodiment, has a circular cross-section and extends perpendicular to a plane 17 of the plate-like thick conductor piece 3 through the same. In particular, the receptacle 15 may be a stamped through hole 13 which can be formed during stamp-bending of the thick conductor piece 3. In the alternative, the receptacle 15 may be formed by other methods, such as drilling. Instead of a through hole 13, the receptacle 15 may also be formed as a blind hole.

The thin conductor piece 5 is provided with a protrusion 19 for insertion into the receptacle 15. The protrusion 19, in an embodiment, is pre-shaped. In other words, the protrusion 19 is shaped prior to insertion into the receptacle 15. In an assembled state 21, which is shown in FIG. 2, the protrusion 19 is arranged between the press-fit element 11 and the inner wall 23 of the receptacle 15 and the thick conductor piece 3. The protrusion 19, which is a part of the thin conductor piece 5, is, in the assembled state 21, in electrical contact with the thick conductor piece 3, such that the press-fit element 11 may press the thin conductor piece 5 against the inner wall 23 of the receptacle 15, thereby establishing an electrical and mechanical connection between the thick conductor piece 3 and the thin conductor piece 5. Due to a radial force exerted from the press-fit element 11 along its whole circumference and from the thick conductor piece 3 in a direction opposite to the force exerted from the press-fit element 11, the protrusion 19 is pressed against the inner wall 23 which is part of the thick conductor piece 3, such that the protrusion 19 is held in place by a press-fit connection provided by the press-fit element 11. The term radial force relates to a force exerted perpendicular to an insertion direction 25, which is the direction along which the press-fit element 11 is inserted into the receptacle 15. The radial force 27 is depicted with an arrow in FIG. 2.

In the assembled state 21, the thick conductor piece 3 and the thin conductor piece 5 are arranged parallel with each other and, thereby, parallel with the plane 17 of the thick conductor piece 3 and, in an embodiment, abut each other. The protrusion 19 may extend through the receptacle 15 and protrude from an underside 29 of the thick conductor piece 3. The term underside 29 refers to the side of the thick conductor piece 3, which is opposite the side on which the thin conductor piece 5 is arranged. Consequently, the protrusion 19 may have a length 31, which is larger than a thickness 33 of the thick conductor piece 3. Alternatively, the length 31 may be equal or smaller than the thickness 33. Thereby, the length 31 is measured along a direction parallel to the insertion direction 25 and/or perpendicular to the plane 17 of the thick conductor piece 3.

As shown in FIG. 2, the protrusion 19 surrounds an insertion opening 35 for the press-fit element 11, the insertion opening 35 being arranged in the thin conductor piece 5.

Just by way of example, the protrusion 19 has an overall circular cross-section perpendicular to the insertion direction 25. In an embodiment, the protrusion 19 has an overall cylindrical shape, wherein the axis of the cylinder is coaxial with the insertion direction 25 in the assembled state 21. Alternatively, the protrusion 19 has the shape of a collar, in particular an overall circular shape formed continuously in the circumferential direction along the circular shape. In other words, the protrusion 19 is in some embodiments formed as a tube which may have a cylindrical conical shape. In this case, the protrusion 19 may abut the inner wall 23 of the receptacle 15 along its whole circumference in the assembled state 21. Thereby, a large contact area between the thick conductor piece 3 and the thin conductor piece 5 may be provided. The protrusion 19 may, in particular, have an overall cylindrical shape. However, the protrusion 19 may also be provided with other shapes, such as a conical shape which tapers in a direction away from the remaining thin conductor piece 5 and may thereby facilitate the insertion of the protrusion 19 into the receptacle 15. Additionally, the protrusion 19 may be tin plated prior to insertion into the receptacle 15 in order to protect the material of the protrusion 19 and to improve the electrical and/or mechanical connection with the thick conductor piece 3.

As shown in FIGS. 1 and 2, the receptacle 15 is shaped geometrically similar to the protrusion 19 and, therefore, has an overall round shape. In the assembled state 21, of an embodiment, the protrusion 19 abuts the inner wall 23 of the receptacle 15 and is, therefore, in contact with the thick conductor piece 3 along the whole circumference of the protrusion 19.

The thin conductor piece 5 may be, at least at the protrusion 19, tin-plated in order to improve the electrical contact and/or to avoid sealing process between the thick conductor piece 3 and the thin conductor pieces 5.

The protrusion 19 extends essentially perpendicular to the thin conductor piece 5 in the vicinity of the protrusion 19. Additionally, the thin conductor piece 5 may, at least in part, have an overall planar shape. From a plane of the thin conductor piece 5, the protrusion 19 extends essentially perpendicular to the plane.

As shown in FIGS. 1-3, a diameter 37 of the protrusion 19, measured perpendicular to the insertion direction 25, is, in an embodiment, smaller than a diameter 39 of the receptacle 15. Thereby, insertion of the protrusion 19 into the receptacle 15 is facilitated. After insertion of the protrusion 19 into the receptacle 15, the radial force 27 exerted by the press-fit element 11 may stretch the material of the thin conductor piece 5 in the protrusion 19 such that the protrusion 19 abuts the inner wall 23.

The thickness 41 of the thin conductor piece 5 adjacent to the at least one protrusion 19 is smaller than the thickness 33 of the thick conductor piece 3 adjacent to at least one receptacle 15, as shown in FIG. 2. In an embodiment, the thin conductor piece 3 is more flexible than the thick conductor piece 5. In particular, the thin conductor piece 5 may have a thickness 41 measuring less than 100 µm, and, in an embodiment, is less than and 50 µm. The thickness of the thick conductor piece 3 may be less than 3 mm, and, in an embodiment, is less than 1 mm.

The press-fit element 11, in an embodiment, has the overall shape of a disc. According to an embodiment, the diameter 45 may be up to 10 mm, as shown in FIG. 1. However, depending on the requirements, the diameter may also be larger.

In the case of a disc-shape, the thickness 43 of the press-fit element 11, measured along the insertion direction 25 in the assembled state 21, is, in an embodiment, smaller than a diameter 45 of the press-fit element 11 and is between one and two times the thickness 33 of the thick conductor piece 3, as shown in FIGS. 1 and 2. One of ordinary skill in the art would understand that smaller or larger thicknesses are also possible. Consequently, the disc-shaped press-fit element 11 is arranged parallel to the thick conductor piece 3 in the assembled state 21. One of ordinary skill in the art would appreciate that the disc shape, (i.e. flat shape), saves material and may result in a press-fit element 11 that is, in the assembled state 21, mostly inserted into the receptacle 15. The disc shape, in particular in contrast to a rod-shape or bolt-shape, prevents large portions of the press-fit element 11 from protruding out of the receptacle 15 in the assembled state 21. This may reduce the risk of damage to the connection assembly. The press-fit element 11 may also have the shape of a pill, for example a disc with two oppositely arranged convex sites.

The press-fit element 11 has a geometrically similar cross-section to the protrusion 19, the receptacle 15, and the plane 17 of the thick conductor piece 3, as shown in FIGS. 1 and 2. In other words, the protrusion 19 and the receptacle 15 may have a similar shape, but different sizes. If the receptacle 15 has an overall circular shape, then the protrusion 19, in an embodiment, also has a circular shape. If the receptacle 15 has an overall polygonal shape, then the protrusion 19 also has a polygonal shape. The shape of the press-fit element 11 also resembles the shape of the protrusion 19 and/or the receptacle 15. In an embodiment, the press-fit element 11 consequently has an overall circular cross-section shape for being inserted into the insertion opening 35 and the receptacle 15. The cross-section refers to a cross-section being perpendicular to an insertion direction of the protrusion 19 and/or the press-fit element 11 or parallel with the plane of the thick conductor piece 3, as shown in FIGS. 1 and 2. One of ordinary skill in the art would appreciate the press-fit element 11 may have any other shape cross-section such as a polygon an oval shape or a pill-like shape. The diameter 45 is, in an embodiment, identical to or smaller than the diameter 39 of the receptacle, as shown in FIG. 1. The diameter 45 is chosen such that a radial force may be exerted onto the protrusion 19 towards the inner wall 23 in the assembled state 21.

The press-fit element is, in an embodiment, elastically compressible, at least in a direction parallel with its diameter 45. The press-fit element may be compressed during insertion such that it may press the protrusion 19 against the inner wall 23 of the receptacle 15.

In order to facilitate the compression of the press-fit element 11, the press-fit element 11, in an embodiment, has an overall shape of a ring, as shown in FIGS. 1-2 and 5-6. Consequently, the press-fit element 11 is provided with a through hole 47 in its center, the through hole 47 extends parallel with the insertion direction 25. One of ordinary skill in the art would appreciate that the ring-shaped press-fit element 11 may have increased flexibility compared to a similarly formed press-fit element without the hole. The through hole 47 may also be used for inserting a tool, which can be used for aligning the press-fit element 11 with the insertion opening 35, and for pressing the press-fit element into the receptacle 15, thereby facilitating insertion into the receptacle 15. Additionally, one of ordinary skill in the art would appreciate that the hole 47 could be used for inserting other elements such as fixation means.

Figure 4:
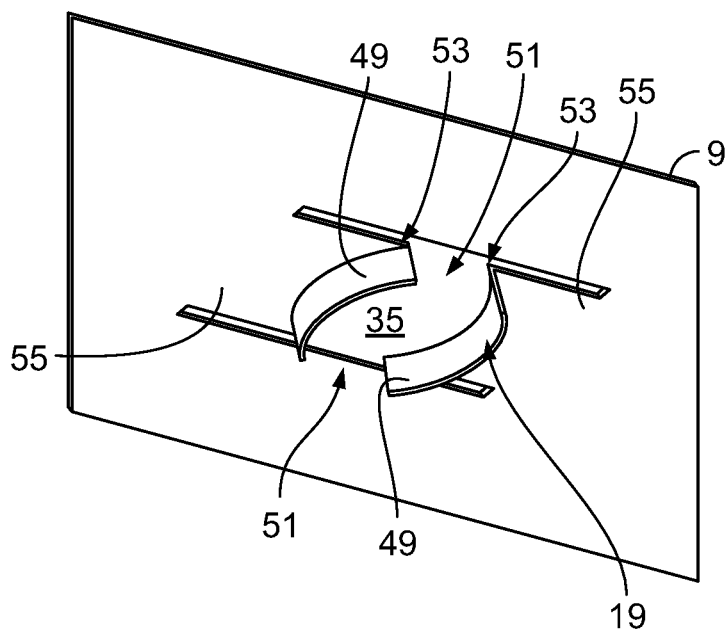
FIG. 4 is a perspective view of an embodiment of a protrusion of the connection assembly of FIG. 1.

In FIG. 4, an embodiment of a protrusion 19 is shown. Here the protrusion 19 may also be used in an assembly 1 as described above.

In contrast to the protrusion 19, shown in FIG. 3, the protrusion 19 shown in FIG. 4 is not provided with a continuous cylindrical shape along the circumference. Instead, in FIG. 4, the protrusion 19 is only provided with parts 49 of a cylindrical shape. These two parts 49 are arranged opposite each other across the insertion opening 35. In other words, the protrusion 19 has an overall cylindrical shape which is interrupted by two interruptions 51 which are arranged opposite each other across the insertion opening 35.

One of ordinary skill in the art would appreciate that the protrusion 19 may also be formed with a plurality of interruptions 51 and, consequently, with a plurality of parts 49. According to an embodiment of the invention, the protrusion 19 may be formed by only a single part 49. As shown in FIG. 4, the two parts 49 are each seated on a free end 53 of a tongue 55. Each tongue 55 is elastically deflectable. Thereby, the parts 49 are provided with a movability which may facilitate the insertion of the protrusion 19 into the receptacle 15.

Alternatively, an embodiment of the protrusion 19 may, instead of having an overall cylindrical shape, have an overall conical shape e.g., the protrusion 19 may be formed as a strip which can be arranged between a press-fit element 11 and the inner wall 23 of the receptacle 15. Likewise, the protrusion 19 may have an overall cylindrical shape which is provided with slits, interruptions or recesses which extend parallel to an insertion direction 25 into the material of the protrusion 19. If, for example, the protrusion 19 is provided with two such slits, and if these slits are arranged opposite to each other, then the protrusion 19 is formed by two half-cylinders which are arranged opposite each other. Additionally, the protrusion 19, in particular a protrusion 19 with an overall circular shape, may be formed by stamping a hole into the thin conductor piece 5, in particular a round hole. Afterwards, the material in the close vicinity of the hole may be deep drawn or stretched such that material of the thin conductor piece 5 forms the at least one protrusion 19. In the alternative, the at least one protrusion 19 may be formed by drilling.

Figure 5:
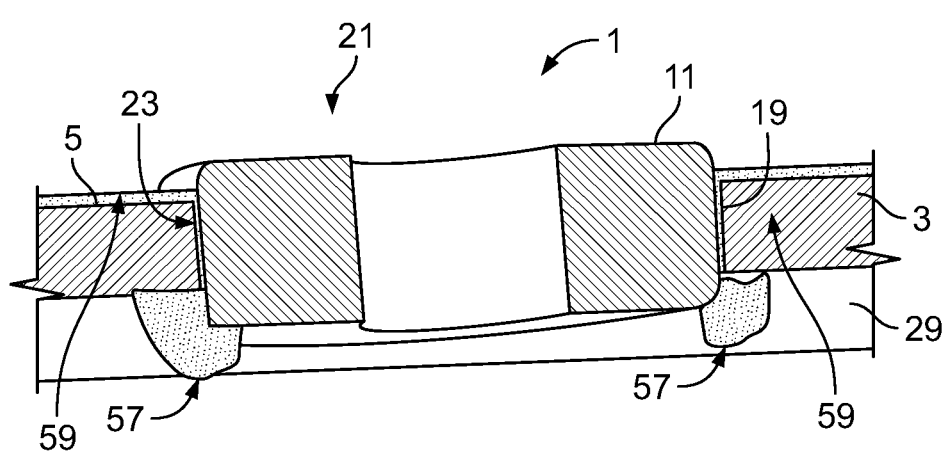
FIG. 5 is a cross-sectional view of the connection assembly with an applied sealant of FIG. 1.

In the following, a further embodiment of the assembly 1 according to the invention is shown in FIG. 5. The assembly 1, may be formed according to any one of the embodiments described above and the protrusion 19 may either be formed according to the embodiment of FIG. 3 or the embodiment of FIG. 5. The protrusion 19 may of course also be formed with any other appropriate shape.

The assembly 1, as shown in FIG. 5, is provided with a sealant 57 for sealing the interface between the protrusion 19 and the press-fit element 11 and also the interface between the protrusion 19 and the inner wall 23. In an embodiment, the sealant extends circumferentially along the assembly 1, following the course of the protrusion 19.

The sealant may be applied to the underside 29 of the thick conductor piece 3, as shown in FIG. 5. Additionally, the opposite side of the assembly 1 may also be provided with sealant 57 to seal the interface between the thin conductor piece 5 and the thick conductor piece 3. The sealant 57 may be provided after the assembly 1 is in the assembled state 21.

Parts of the assembly may also be provided with an adhesive sealant, in particular an adhesive sealant 59 in order to seal the contact area between thin conductor piece 5 and thick conductor piece 3 and to increase mechanical stability between the parts, as shown in FIG. 5. In particular, the vicinity around the receptacle 15 may be provided with a sealant 57 or adhesive sealant 59 prior to bringing the thick and thin conductor pieces 3 and 5 together and to seal the contact interface between thin conductor piece 5 and the thick conductor piece 3. Further by way of example, the sealant 57 and/or adhesive sealant 59 may be applied prior to inserting the press-fit element 11 into the receptacle 15. Likewise, the sealant 57 and/or adhesive sealant 59 may be applied around a rim of the receptacle 15 prior to insertion. Additionally, the sealant 57 and/or adhesive sealant 59 may be applied where needed after insertion of the press-fit element 11. The adhesive sealant 59 may glue the thin conductor piece 5 to the thick conductor piece 3, whereas a sealant 57 may seal interfaces between the parts, in particular an interface between the thick conductor piece 3 and the thin conductor piece 5 or between the press-fit element 11 and thick conductor piece 3 and the thin conductor piece 5.

Also the inner wall 23 can be provided with adhesive sealant 59 prior to insertion of the protrusion 19. One of ordinary skill in the art would appreciate that the adhesive sealant 59 could also be provided on the thin conductor piece 5 prior to insertion in order to achieve the same result.

Figure 6:
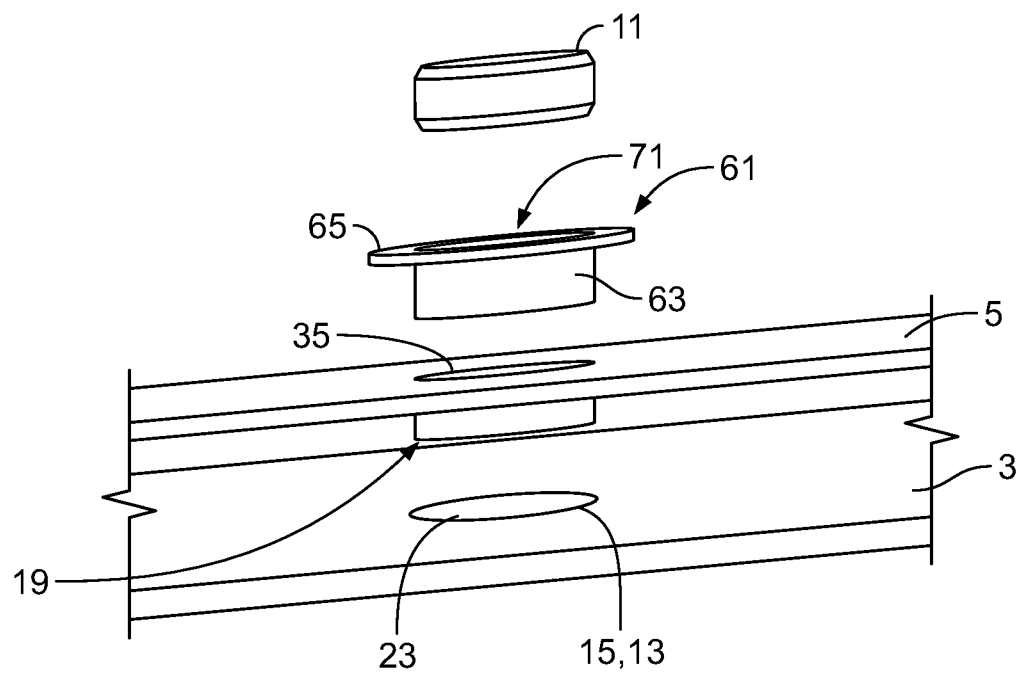
FIG. 6 is an exploded perspective view of the connection assembly of FIG. 1 with a bushing.
Figure 7:
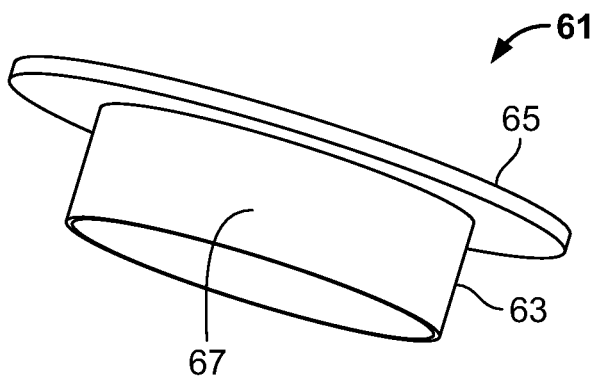
FIG. 7 is a perspective close-up view of the bushing of the connection assembly of FIG. 6.
Figure 8:
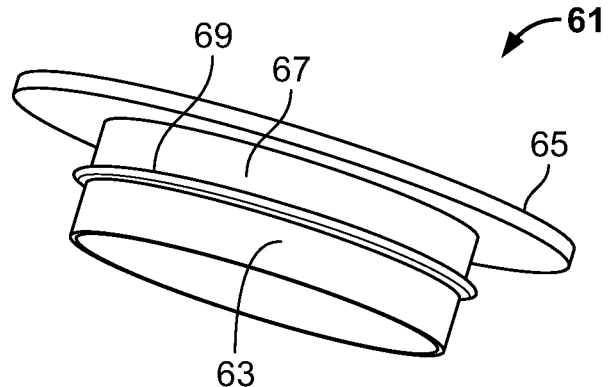
FIG. 8 is a perspective close-up view of another embodiment of the bushing of the connection assembly.

In the following, further embodiments of the assembly 1 will be described with respect to FIGS. 6 to 8. The assembly 1 is shown in FIG. 6 prior to assembling and FIGS. 7 and 8 show two embodiments of a bushing 61 which can be used, for example, with the assembly 1 of FIG. 6. For the sake of brevity, only the differences with respect to those features described above will be described here.

As shown in FIG. 6, there are similar parts as to those detailed above. However, here an additional bushing 61 is provided which can be inserted into the receptacle 15 after the protrusion 19 has been inserted. Consequently, the bushing 61 extends into (i.e., inserted into) the insertion opening 35 of the thin conductor piece 5 in the assembled state 21.

As shown in FIG. 6, the diameters of the insertion opening 35, the receptacle 15 and/or the press-fit element 11 are adapted accordingly in order to allow the press-fit element 11 to be inserted.

As further shown in FIG. 6, a cylindrical portion 63 of the bushing 61 is arranged between the press-fit element 11 and the protrusion 19 of the thin conductor piece 5 and, consequently, the inner wall 23 in the assembled state (not shown). The bushing 61 may be inserted after the insertion of the protrusion 19 into the receptacle 15. After insertion of the bushing 61, the press-fit element 11 may be inserted into an insertion opening 35 of the bushing 61. The bushing 61 may protect the thin conductor piece 5 or at least the protrusion 19 of the same during insertion of the press-fit element 11 into the bushing 61. This is particularly helpful when the thin conductor piece 5 is made from a material that is easily damaged, (e.g., when the material is thinner than 100 μm).

As shown in FIGS. 6-8, the bushing 61 is, in an embodiment, flexible or stretchable in order to allow a force exerted by the press-fit element 11 to press the protrusion 19 against the thick conductor piece 3. In particular, the bushing 61 may be made from metal such as steel with a thickness small enough to fulfill the bushing's function. In an embodiment, the bushing 61 is provided with a flange portion 65 on one of its axial ends. The flange portion 65 may abut the thin conductor piece 5 and be arranged adjacent the receptacle 15 in the assembled state, therefore facilitating insertion of the bushing 61 and protecting a transition region between the planar-shaped thin conductor piece 5 and the protrusion 19. Further, the flange 65 extends radially over the cylindrical portion 63 and opens up an insertion opening 71 at its center for insertion of the press-fit element 11.

The cylindrical portion 63 may be formed continuously along its circumference, as shown in FIGS. 6-8. However, said portion may also be provided with interruptions or slits as long as it is still capable of spacing the press-fit element 11 apart from the protrusion 19.

The cylindrical shape of the bushing 61 is not mandatory. In an embodiment, the other parts also have essentially circular cross-sections. If, however, the assembly 1 is provided with parts following a different shape, then the bushing, in particular the portion 63, may have a shape that differs from a cylindrical shape and follows the shape of the other parts.

As shown in FIG. 7, the bushing 61 has an outer surface 67 which follows the cylindrical shape. The bushing 61, shown in FIG. 8, has an essentially similar surface 67 but is, additionally, provided with a circumferential rib 69 which extends circumferentially around the cylindrical portion 63. One skilled in the art would appreciate that the bushing 61 may be provided with one, two, three or more ribs 69. A plurality of ribs 69 may be arranged such that the ribs 69 are parallel with each other. The rib 69 can be formed continuously along the circumference of the bushing 61. In the alternative, the rib 69 may be interrupted or formed as a series of dots only. As an alternative to the rib 69, the bushing 61 may be provided with at least one protrusion 19 on its outer side. By further way of example, the outer side of the bushing 61 may also be provided with a knob or a plurality of knobs. In the case of a plurality of knobs, these knobs are, in an embodiment, spread around the outer surface 67 of the bushing 61. Alternatively with respect to the cylindrical shape, the bushing 61 may have a conical shape in order to facilitate insertion into the receptacle 15. Additionally, the bushing 61 may instead be formed with slits which extend parallel to an axial direction of the bushing 61.

The bushing 61 may be provided with one or more of the ribs 69 which projects from an outer side of the bushing 61 towards the at least one protrusion 19 in the assembled state 21. The ribs 69 may help to remove oxide layers from the inner wall 23 and, therefore, to improve the electrical contact between the conductor pieces 3 and 5, in particular, when at least one of the conductor pieces 3 and 5 is made from aluminum. In the assembled state 21, the force which presses the protrusion 19 of the thin conductor piece 5 against the inner wall 23 of the receptacle 15 is increased in the region of the rib 69 since the bushing 61 has an increased diameter in this region.

One skilled in the art would appreciate that alternative means to the bushing 61 can fulfill the same function as the bushing 61. For example, at least two sliding members can be inserted into the receptacle 15 after insertion of the protrusion 19. These sliding members may allow insertion of the press-fit element 11 without damaging the protrusion 19 since they may function as spacers. In the assembled state 21, the press-fit element 11 may press against at least one of these sliding members, which in turn presses the protrusion 19 against the inner wall 23 of the receptacle 15. The sliding members may be formed as strips or rods. If two sliding members are present, these two sliding members can be arranged opposite one another across the receptacle 15 in the assembled state 21. If more sliding members are provided, these members can be arranged equidistant to one another along the circumference of the receptacle 15.

The invention is further directed to a method of connecting at least one thin conductor piece 5 with at least one thick conductor piece 3 wherein at least one protrusion 19 of the at least one thin conductor piece 5 is inserted into at least one receptacle 15 in the thick conductor piece 3, and wherein at least one press-fit element 11 is inserted into the receptacle 15, pressing the at least one protrusion 19 against an inner wall 23 of the receptacle 15, wherein at least one bushing 61 is inserted into an insertion opening 35 of the thin conductor piece 5 and the press-fit element 11 is subsequently inserted into the bushing 61.

It should be noted that, in an embodiment, the connection assembly 1 and the method according to the invention are for numerous connections between a thin conductor piece 5 and a thick conductor piece 3 due to the press connection. In particular, twenty connections or more can be produced at the same time by a device being provided with a plurality of insertion tools for the press-fit elements 11. Consequently, a plurality of press-fit elements 11 can be inserted into a plurality of receptacles 15 with a single movement of a device.

One skilled in the art would appreciate the embodiments are intended to be illustrative, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the invention, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A connection assembly comprising:
   a thick conductor piece including a receptacle having an inner wall;
   a thin conductor piece for electrically connecting to the thick conductor piece and having a protrusion for insertion into the receptacle, the protrusion directly contacting the inner wall of the thick conductor piece; and
   a press-fit element inserted into the receptacle with the protrusion in the receptacle between the press-fit element and the thick conductor piece, the press-fit element comprising, prior to insertion into the receptacle, a shape having a generally uniform diameter over its length that is greater than a dimension of the protrusion in a direction perpendicular to an insertion direction of the press-fit element and configured to be substantially only elastically deformed as it is inserted into the receptacle for forming a press-fit connection between the protrusion and the inner wall.

2. The connection assembly of claim 1, wherein the thin conductor piece has an insertion opening and the protrusion partly surrounds the insertion opening of the thin conductor piece for inserting the press-fit element.

3. The connection assembly of claim 2, wherein the protrusion protrudes essentially perpendicular from a neighboring section of the thin conductor piece, the protrusion extending through the receptacle and protruding from an underside of the thick conductor.

4. The connection assembly of claim 3, wherein the protrusion and the receptacle have geometrically similar cross-sections in the plane of the thick conductor piece.

5. The connection assembly of claim 2, wherein a thickness of the thin conductor piece adjacent to the protrusion is smaller than the thickness of the thick conductor piece adjacent to the receptacle.

6. The connection assembly of claim 1, wherein the press-fit element has a disc-like shape, the press-fit element having a thickness in the insertion direction that is less than the diameter of the press-fit element and a though hole formed therethrough in a direction of the thickness.

7. The connection assembly of claim 1, wherein the receptacle is a through hole.

8. The connection assembly of claim 1, wherein the thick conductor piece has, in a vicinity of the receptacle, a sealant and/or an adhesive sealant.

9. The connection assembly of claim 1, wherein the thin conductor piece is at least a part of a flexible printed circuit or of a flat flexible cable.

10. The connection assembly of claim 9, wherein the thin conductor piece is a conductive layer of a printed circuit board.

11. The connection assembly of claim 1, wherein the assembly further comprises a bushing between the press-fit element and the protrusion of the thin conductor piece in an assembled state.

12. The connection assembly of claim 11, wherein the bushing has a rib which projects from an outer side of the bushing towards the protrusion in the assembled state.

13. The connection assembly of claim 12, wherein the bushing has a radial flange which is arranged adjacent to the receptacle in the assembled state.

14. The connection assembly of claim 1, wherein the thin conductor piece comprises a conductive foil.

15. The connection assembly of claim 1, wherein the thin conductor piece comprises a conductive copper or copper alloy sheet.

16. The connection assembly of claim 1, configured for a battery management system.

17. A connection assembly comprising:
    a thick conductor piece including a receptacle having an inner wall;
    a thin conductor piece for electrically connecting to the thick conductor piece and having a protrusion for insertion into the receptacle, the protrusion directly contacting the inner wall of the thick conductor piece; and
    a press-fit element adapted to be inserted into the receptacle with the protrusion in the receptacle between the press-fit element and the thick conductor piece, the press-fit element comprising, prior to insertion into the receptacle, a disc-like shape of a generally uniform diameter over its length, the diameter prior to insertion into the receptacle greater than a dimension of the protrusion in a direction perpendicular to an insertion direction of the press-fit element, the press-fit element configured to be substantially only elastically deformed for generating a press-fit connection once inserted into the receptacle.

18. The connection assembly of claim 17, wherein, in an assembled state of the assembly, the press-fit connection is generated between the protrusion and the inner wall by the press-fit element and the thick conductor piece.

* * * * *